United States Patent
Colbourne

(10) Patent No.: US 11,867,486 B2
(45) Date of Patent: Jan. 9, 2024

(54) ELECTRONIC STUN GRENADE

(71) Applicant: THE SECRETARY OF STATE FOR DEFENCE, Salisbury (GB)

(72) Inventor: Ross Colbourne, Salisbury (GB)

(73) Assignee: The Secretary of State for Defence, Salisbury (GB)

( * ) Notice: Subject to any disclaimer, the term of this patent is extended or adjusted under 35 U.S.C. 154(b) by 0 days.

(21) Appl. No.: 17/055,162

(22) PCT Filed: May 22, 2019

(86) PCT No.: PCT/GB2019/000071
§ 371 (c)(1),
(2) Date: Nov. 13, 2020

(87) PCT Pub. No.: WO2019/234377
PCT Pub. Date: Dec. 12, 2019

(65) Prior Publication Data
US 2021/0199412 A1    Jul. 1, 2021

(30) Foreign Application Priority Data
Jun. 5, 2018 (GB) ...................... 1809188

(51) Int. Cl.
*F42B 8/26* (2006.01)
*F42B 12/42* (2006.01)
(Continued)

(52) U.S. Cl.
CPC ......... *F42B 12/42* (2013.01); *F41H 13/0087* (2013.01); *F42B 8/26* (2013.01); *F42B 27/00* (2013.01); *H05K 7/2039* (2013.01)

(58) Field of Classification Search
CPC ...... F42B 8/26; F42B 8/18; F42B 8/20; F42B 12/42; F42B 27/00; F42B 30/04; F41H 13/00
See application file for complete search history.

(56) References Cited

U.S. PATENT DOCUMENTS

| 8,113,689 B2 * | 2/2012 | Mayo ...................... F42B 27/00 362/112 |
| 8,398,258 B1 * | 3/2013 | Gerrish ................. F21V 23/045 362/802 |

(Continued)

FOREIGN PATENT DOCUMENTS

| EP | 3023730 A1 * | 5/2016 | ......... F41H 13/0087 |
| EP | 3023731 A1 * | 5/2016 | ......... F41H 13/0087 |

(Continued)

OTHER PUBLICATIONS

Gino27850, Electronic Airsoft Grenade REMIX, Jan. 24, 2018, MakerBot Thingiverse, all pages and images. < https://www.thingiverse.com/thing:2768097/files> (Year: 2018).*

(Continued)

*Primary Examiner* — Jonathan C Weber
(74) *Attorney, Agent, or Firm* — Kilpatrick Townsend & Stockton LLP

(57) ABSTRACT

An electronic stun grenade (10) comprising a casing (11) and a means for generating light (13), wherein the means for generating light (13) is mounted onto an exterior surface of the casing (11). This allows the interior volume defined by the casing (11) to be more effectively used for containing a means for powering the means for generating light (13). Particularly suited to applications requiring compact stun grenades, such as man portable or weapon launched devices.

14 Claims, 3 Drawing Sheets

(51) Int. Cl.
 *F41H 13/00* (2006.01)
 *F42B 27/00* (2006.01)
 *H05K 7/20* (2006.01)

(56) References Cited

U.S. PATENT DOCUMENTS

| | | | | |
|---|---|---|---|---|
| 9,016,888 B2 * | 4/2015 | Glynn | ................... | H05B 41/34 |
| | | | | 102/512 |
| 2005/0188885 A1 | 9/2005 | Daigle et al. | | |
| 2007/0195527 A1 * | 8/2007 | Russell | ................... | F21V 29/83 |
| | | | | 362/240 |
| 2008/0216699 A1 * | 9/2008 | McAleer | ................... | F42B 8/26 |
| | | | | 362/112 |
| 2016/0309550 A1 * | 10/2016 | Xiong | ................. | H05B 45/305 |
| 2018/0080748 A1 | 3/2018 | Sotola et al. | | |
| 2019/0285392 A1 * | 9/2019 | Black | .................. | F41H 13/0087 |
| 2021/0254936 A1 * | 8/2021 | Hoelzl | ................ | F41H 13/0087 |

FOREIGN PATENT DOCUMENTS

| | | | | | |
|---|---|---|---|---|---|
| EP | 3348954 A1 | * | 7/2018 | ......... | F41H 13/0081 |
| GB | 2387644 A | | 10/2003 | | |
| GB | 2522212 A | | 7/2015 | | |
| GB | 2555865 A | | 5/2018 | | |
| GB | 2557453 A | * | 6/2018 | ......... | F41H 13/0081 |
| GB | 2557453 B | * | 12/2019 | ......... | F41H 13/0081 |
| WO | 2018091874 A1 | | 5/2018 | | |
| WO | WO-2018091872 A1 | * | 5/2018 | ......... | F41H 13/0081 |

OTHER PUBLICATIONS

United Kingdom Patent Application No. GB1809188.4, Search Report dated Jul. 26, 2018, 3 pages.
International Patent Application No. PCT/GB2019/000071, International Search Report and Written Opinion dated Aug. 14, 2019, 12 pages.
United Kingdom Patent Application No. GB1907201.6, Combined Search and Examination Report dated Oct. 22, 2019, 5 pages.
International Patent Application No. PCT/GB2019/000071, International Preliminary Report on Patentability dated Dec. 17, 2020, 8 pages.

* cited by examiner

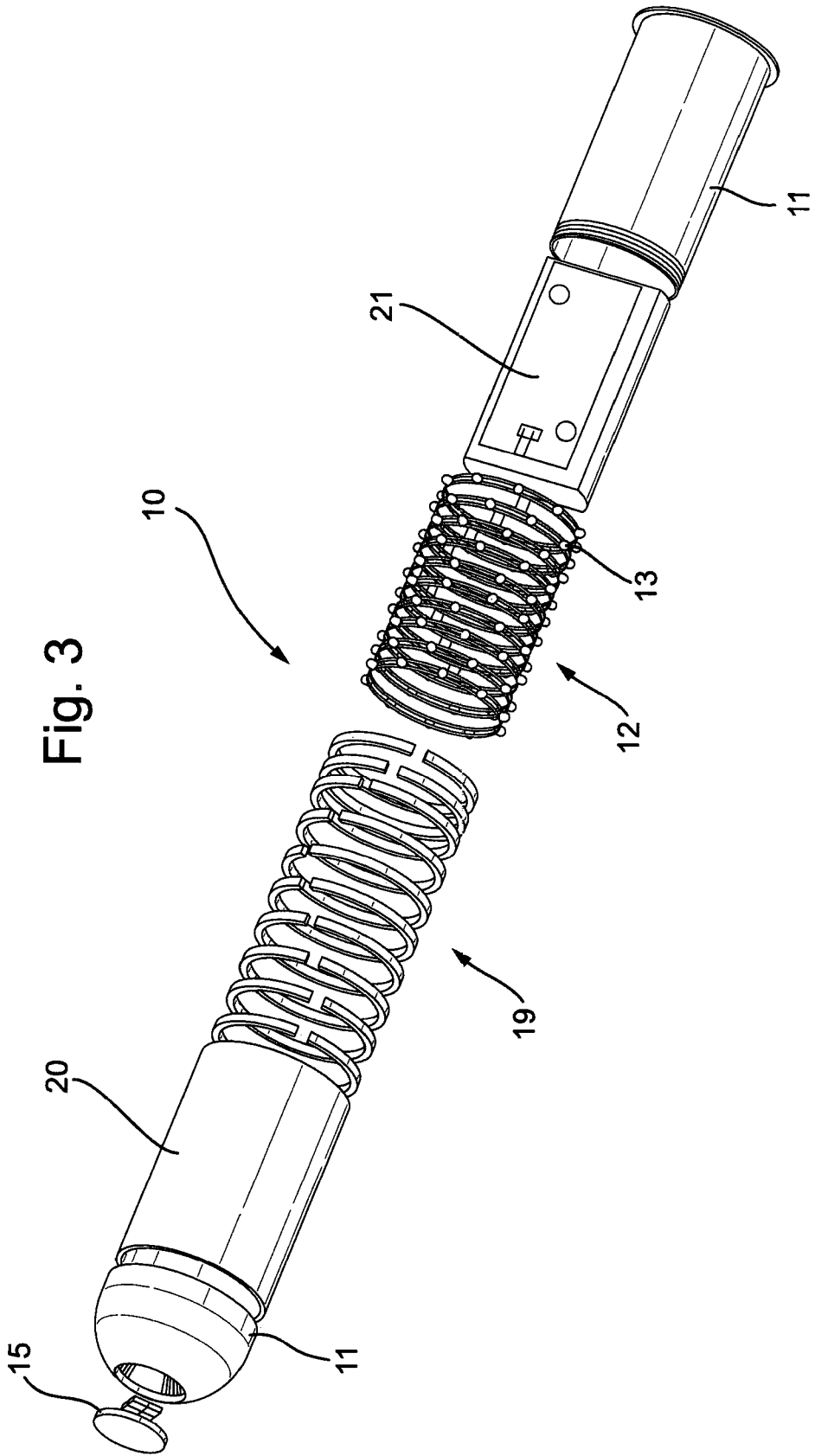

ELECTRONIC STUN GRENADE

TECHNICAL FIELD OF THE INVENTION

This invention relates to the field of electronic stun grenades.

BACKGROUND TO THE INVENTION

Stun grenades are used by the military and security services, and are also used recreationally in activities such as paintballing. A stun grenade is a device that can be deployed by a user in order to disorient another individual or sensor by saturating their vision with high intensity radiation (light). An electronic stun grenade generates light through use of an electrically powered radiation source. The benefit of an electronic stun grenade is that explosive material is not required in order to generate light, thereby making the stun grenade safer to handle and use. Furthermore the light generated from an electronic stun grenade is more readily controlled with respect to intensity, pulsing, and other effects. Light emitting diodes (LEDs) have been successfully used for this role.

A technical challenge associated with electronic stun grenades is the power requirement, which often competes with size and weight constraints. Current electronic stun grenades are considerably larger than their pyrotechnic equivalents. This is because they must contain a large often dense and heavy power source, along with any means for generating light and associated wiring and control systems. These electronic stun grenades place additional burden on a user, particularly if the user is required to carry the stun grenade prior to its use. To decrease the size or weight of an electronic stun grenade, a decrease in performance generally results, owing to the smaller form factor available for containing the various components.

Therefore it is an aim of the present invention to provide an alternative electronic stun grenade that mitigates these issues.

SUMMARY OF THE INVENTION

According to a first aspect of the invention there is provided an electronic stun grenade comprising a casing and a means for generating light, wherein the means for generating light is mounted onto an exterior surface of the casing, such that an interior volume defined by the casing can be used for containing a means for powering the means for generating light.

Prior art electronic stun grenades consist of a casing, potentially with windows, inside of which a means for generating light is mounted. Furthermore the wiring or electrical connections associated with the means for generating light are also contained within the casing of prior art stun grenades. As a result the volume inside the casing available for a power supply is limited. This inevitably results in a reduction in the amount of energy storable inside the casing, and consequently either a reduction in peak power output achievable from the means for generating light, or a reduction in operational time.

An option for increasing the amount of power available in a stun grenade is to increase the casing size to accommodate a larger power supply. However this results in a heavier stun grenade owing to the additional weight of the casing, which is undesirable for some applications where weight is a significant constraint (for instance stun grenades that can be launched from grenade launchers). The inventor has identified an alternative approach by using the exterior surface of a casing for mounting a means for generating light. Therefore for a given size of casing the internal volume available for a power supply can be increased.

The inventor has also identified that when reducing the size of an electronic stun grenade (for instance to a 40 mm format), the internal spatial volume occupied by electrical wiring becomes more significant, and that by providing means for generating light on an external surface of the casing, additionally enables associated electrical wiring to also be mounted externally.

The casing itself may be cylindrical or other shape. The casing has a finite thickness with an external surface that faces outwardly from the electronic stun grenade. The interior surface of the casing defines the interior volume—a void or space into which other items of the electronic stun grenade may be contained.

The means for generating light is intended to be one or more radiation sources that convert electrical energy into visible light. Preferably the means for generating light comprises a plurality of light emitting diodes (LEDs). LEDs provide a controllable light source and can be selected according to a desired wavelength or wavelengths of emission. Alternatively LEDs with phosphor coatings may be used to generate a 'white' light source. LEDs are of relatively low profile design in comparison to other light sources. Specifically, surface mountable LEDs arranged around the exterior surface of the casing are preferred. The arrangement of the plurality of LEDs on the exterior surface may be random, but preferably the arrangement is such that in use light is radiated omnidirectionally away from the electronic stun grenade, along the length of the stun grenade. The inventor has shown that 100 surface mounted LEDs can be mounted onto the exterior surface of a 38 mm diameter casing to provide a 40 mm diameter electronic stun grenade.

In preferred embodiments of the electronic stun grenade the plurality of LEDs are mounted onto at least a first electrically conductive band encircling the casing. The electrically conductive bands are used to connect the LEDs to means for powering the LEDs such as an battery internal to the casing. By using relatively low profile (compared to the LEDs) electrically conductive bands, conformal to the exterior surface of the casing, the electrical 'wiring' to/from/between the LEDs is not required to run inside the casing itself. This further maximises the internal volume of the casing that is available for a power supply. Each electrically conductive band may have mounted thereto a number of LEDs equally spaced around the casing to provide omnidirectional radiative performance.

In even more preferred embodiments each electrically conductive band comprises a first and second electrical track, such that LEDs mounted onto the same electrically conductive band are electrically connected in parallel. Even more preferably the electronic stun grenade comprises a plurality of electrically conductive bands electrically connected in series. Having in series with each other, multiple bands of parallel connected LEDs, is referred to as a series-parallel configuration. Prior art electronic stun grenades have used a full series connected LED configuration, powered by high voltage capacitors to deliver short high intensity pulses of light. A full parallel configuration of LEDs significantly reduces the voltage requirement of a power source, but at the expense of increased current requirement (and shortened life of a power source). The inventor has identified that a combination of a series-parallel configuration places less voltage demand on a power source (compared to full series) and less current demand (compared to full parallel).

Whilst the electrically conductive bands may be formed from any electrically conductive material (metals for instance), copper is the preferred material. This is because copper, whilst being electrically conductive, can be readily bent around the electronic stun grenade casing during manufacture. For instance copper rings can relatively easily be formed to slide over and conform to a cylindrical casing.

In some embodiments of the invention a spacer element is provided between the electrically conductive bands and the casing. This may be one spacer element or a plurality. The spacer elements provide added support to the LEDs (to prevent movement or detachment from the electrically conductive bands) and therefore overall structural support to the electronic stun grenade. Other embodiments may not use spacers, instead relying on an interference fit of the electrically conductive bands onto the casing. A electrically insulating layer (an adhesive or paste for instance) may be provided between the casing and the electrically conductive bands, or the bands themselves may have an insulating backing layer.

The casing of the electronic stun grenade may in some embodiments comprise a heat conductive material. The heat conductive material of the casing is intended in these embodiments to at least be proximal to means for generating light. Preferably however the entire casing is formed from a heat conductive material such as copper or steel. A heat conductive casing enables the casing to act as a heat sink for the means for generating light, prolonging the life of the means for generating light, or alternatively enabling the means for generating light to be 'overdriven' by a power source achieving greater light output.

Some embodiments of the invention further comprise a means for powering the means for generating light, the means for powering being contained within the casing. The means for powering is intended to be a battery for instance a thermal battery, lead acid battery, but preferably a lithium high voltage battery. Lithium high voltage batteries provide relatively high power densities such that sufficient power can be contained within relatively small volume casings (for instance ~40 mm casings).

Some embodiments of the invention further comprise a means for controlling the means for generating light. The means for controlling may be a microcontroller (optionally reprogrammable) that controls the mode of operation of the electronic stun grenade (for instance constant or pulsed light emission). Furthermore the microcontroller may control the brightness of the means for generating light, the delay between pulses of light, or the duration of the pulses of light. The microcontroller may comprise one or many of the attributes of the means for generating light. Use of a means for controlling the means for generating light enables the electronic stun grenade to be further tailored to specific applications.

In certain embodiments of the invention the electronic stun grenade further comprises an LED array attached to a first end of the casing, the LED array being electrically connectable to a means for powering the means for generating light, wherein the LED array is orientated such that in use, light generated by the array is directed axially away from the casing. The LED array may be used as a torch or strobe delivering a second use to the electronic stun grenade, for instance if the electronic stun grenade is mounted inside a launcher prior to deployment. The electronic stun grenade casing is generally envisaged to be elongate having a first end and second end. The LED array is intended to be powered from the same power source as the means for generating light.

Some embodiments of the invention further comprise a light transmissive coating covering at least the means for generating light. The coating is intended to be transmissive to the light generated by the means for generating light. The coating may be an epoxy coating that during manufacture of the electronic stun grenade could be applied and then turned down to the required diameter on a lathe and polished to give a clear transparent finish. The coating may be used to alter the optical properties of the means for generating light. The transmissive coating would provide additional environmental protection.

According to a second aspect of the invention there is provided a projectile comprising the electronic stun grenade of any preceding claim, wherein the projectile has a maximum diameter substantially equal to 40 mm. The surface mounting of a means for generating light as a result increases the internal volume of the casing available for housing a power supply, without needing to increase the casing diameter (and consequently mitigating an increase in stun grenade weight). The inventor has shown that an electronic stun grenade car be manufactured having a 40 mm diameter that can be used as a projectile launched from a 40 mm grenade launcher.

BRIEF DESCRIPTION OF THE DRAWINGS

Embodiments of the invention will now be described by way of example only and with reference to the accompanying drawings, in which:

FIG. 3 illustrates an exploded view of an embodiment of the electronic stun grenade.

DETAILED DESCRIPTION

Figure 1:
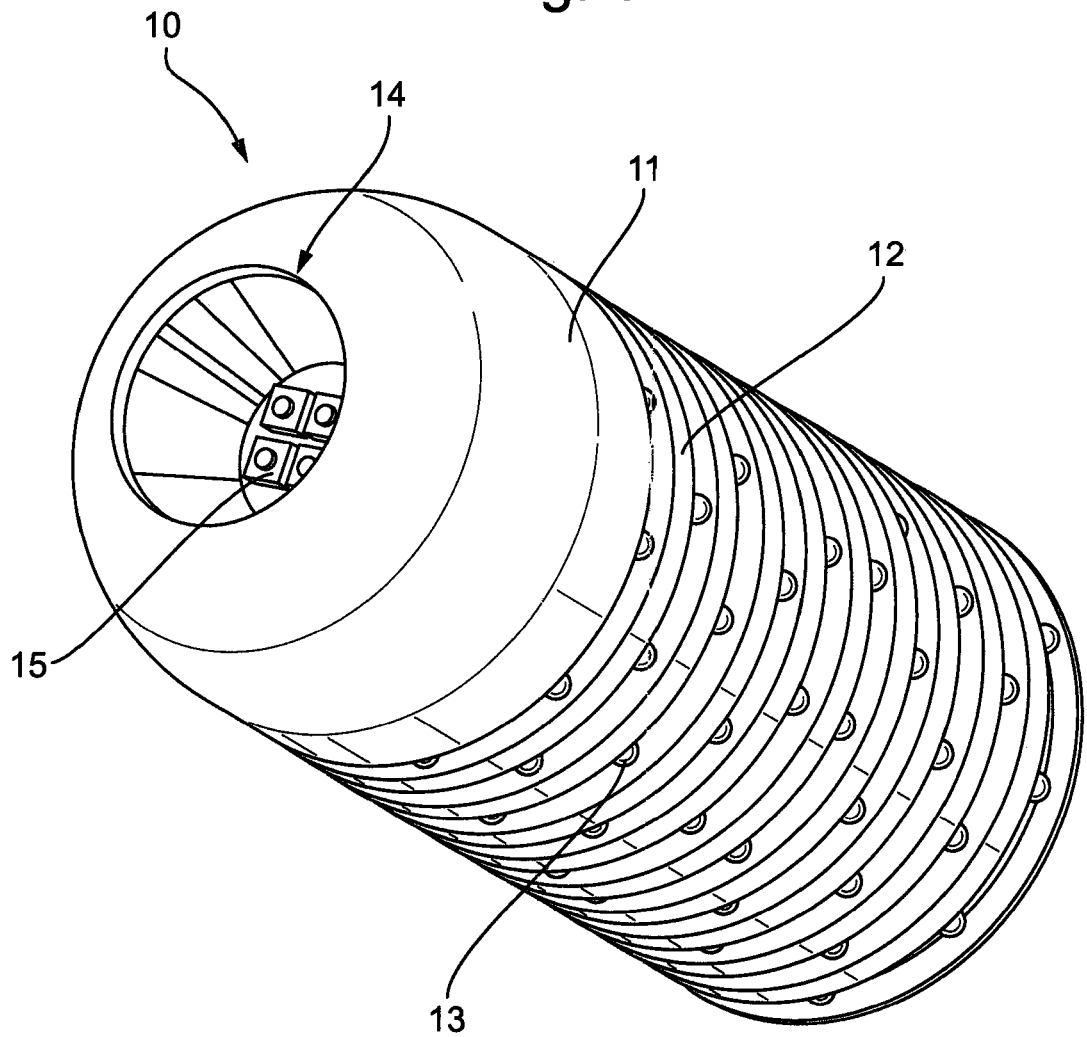
FIG. 1 illustrates a perspective view of an embodiment of the electronic stun grenade.

FIG. 1 illustrates a perspective view of an embodiment of the electronic stun grenade 10. A casing 11 is shown onto which a plurality of electrically conductive bands 12 is mounted. A means for generating light in the form of light emitting diodes 13 is shown attached to electrically conductive bands 12. The casing 11 has a first end 14 in the form of a nose cone. Recessed into the first end 14 is an array of light emitting diodes 15. The casing 11 defines an interior volume suitable for containing a means for powering the light emitting diodes 13. The light emitting diodes 13 are arranged to provide omnidirectional radiation directed away from the casing 13. The light emitting diodes 13 use the 3030 SMD form factor and therefore a variety of different power and wavelength diodes can be used. The light emitting diodes 13 are electrically connected in parallel on each electrically conductive band 12, with the bands themselves being electrically connected in series. The electrically conductive bands 12 are formed from copper. The casing 11 is formed from steel.

Figure 2:
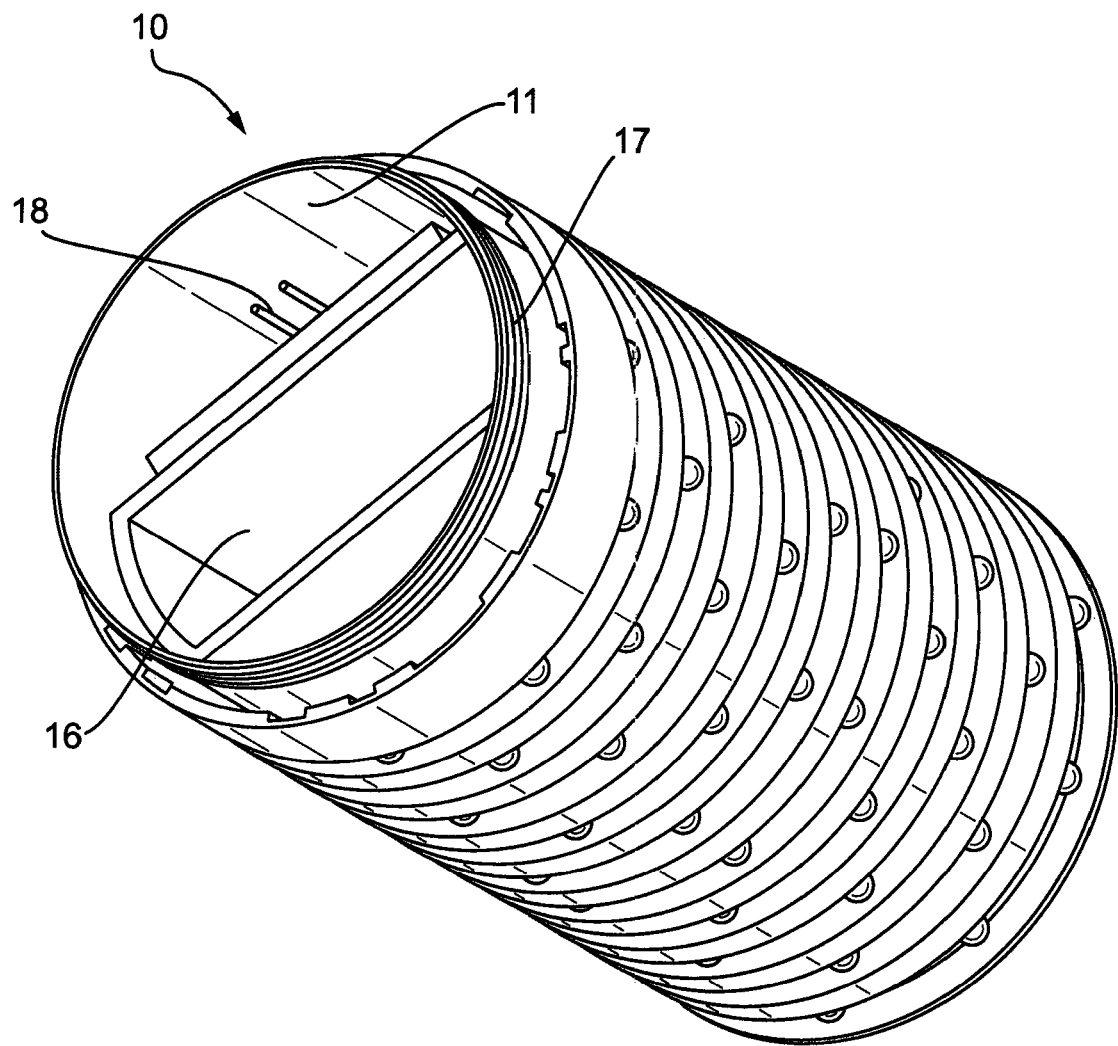
FIG. 2 illustrates a perspective view of an embodiment of the electronic stun grenade with first end of the casing removed.

FIG. 2 illustrates a perspective view of an embodiment of the electronic stun grenade 10. The figure shows casing 11 with nose cone removed. The interior volume of casing 11 is visible. A mounting structure 16 for receiving a high voltage lithium battery is shown. Also shown are electrical pins 18 for electrically connecting an LED array in the nose cone (not shown) of the casing 11. Nose cone (not shown) of casing 11 can be screwed on and off thread 17 to gain access to the interior volume.

FIG. 3 illustrates an exploded view of an embodiment of the electronic stun grenade 10. An LED array 15 is shown separated from the first end of the casing 11 into which it resides. Casing 11 defines an interior volume for high voltage lithium battery and microcontroller 21. Mounted onto casing 11 are spacers 19 and onto spacers 19 the electrically conductive bands 12 are mounted. The spacers 19 provide an interference fit to casing 11. The electrically conductive bands 12 provide an interference fit to spacers 19. LEDs 13 are electrically connected to first and second tracks of electrically conductive bands 12. An epoxy coating 20 covers the LEDs 13. The casing 11 is formed from a heat conductive material such as steel or copper so as to act as a heat sink for LEDs 13. The electrically conductive bands 12 are formed from copper. The epoxy coating 20 is transparent to light generated from the LEDs 13 mounted to conductive bands 12. The LEDs 13 are surface mounted LEDs having a high optical output, for instance OSRAM OSLON Street White LEDs are suitable. The LEDs 13 provide a 120 degree field of view and 300 lumens per LED. The voltage requirement per LED is 2 W. A 7.6V high voltage lithium battery 21 has been used to operate at least two series connected loops of parallel connected LEDs 13. The inventor has also shown up to 100 LEDs can be operated using a series-parallel configuration. The overall diameter of the stun grenade 10 is 40 mm such that it can be mounted within and launched from a 40 mm grenade launcher.

In use the electronic stun grenade 10 may reside within a grenade launcher prior to use. LED array 15 may be operated via a switch in the first end of the casing 11 that a user can depress, or alternatively via a button on the grenade launcher itself (for instance an electrical connection may exist from the grenade launcher to the power source and microcontroller 21). This enables the electronic stun grenade 10 to operate as a torch is required. Upon deployment the stun grenade 10 may be launched (from a grenade launcher) or thrown towards a target location. The user may press a button on the electronic stun grenade 10 to initiate the power supply and microcontroller 21 (or alternatively the act of launching the stun grenade 10 from a grenade launcher may cause the power supply and microcontroller 21 to initiate). The power supply and microcontroller 21 upon receiving an initiation waits for a pre-programmed time delay before triggering power to be supplied to LEDs 13. The time delay may be programmed into the power supply and microcontroller 21 to be sufficient to enable the electronic stun grenade 10 to arrive at a target location (after being launched or thrown) before the LEDs 13 radiate. The power supplied to LEDs 13 may be modulated by power supply and microcontroller 21 to generate a pulsed light effect from LEDs 13.

The shape of the electronic stun grenade casing 10 is shown in the figures to be substantially cylindrical. This is beneficial as the stun grenade will conform to a launch tube of for instance a 40 mm grenade launcher. However the casing 10 may be substantially of other shapes or designs depending on the application. An LED array 15 is an optional feature enabling a dual use of the electronic stun grenade 10, and other light emitting devices may be used instead of the LED array 15 (for instance a bulb). The arrangement of LEDs 13 may be substantially equally spaced around casing 10, however other arrangements that are not equally spaced may be used. An electronic stun grenade 10 with only single electrically conductive band 12 may be used. The interior volume of casing 10 may comprise additional chambers acting as gas expansion chambers. A high pressure gas in an on-board gas cylinder or generator that is vented into these chambers may be used to provide an acoustic distraction effect in additional to a visual effect. The gas may also serve to provide internal cooling to the device.

The invention claimed is:

1. An electronic stun grenade comprising:
a hollow cylindrical casing having a closed first end and an open second end, the hollow cylindrical casing comprising a LED array attached to an exterior surface thereof and directed axially away from the casing and comprising a means for powering the LEDs;
a plurality of electrically conductive bands configured to be slidably received onto and encircle an exterior surface of the casing, each of the electrically conductive bands comprising a least one Light Emitting Diode (LED) that is mounted thereon; and
a plurality of spacer elements configured to be slidably received onto and conform to the exterior surface of the casing, wherein at least one of the plurality of spacer elements is interposed between two of the plurality of electrically conductive bands and comprises a gap adjacent to the exterior surface of the casing and through which two of the plurality of electrically conductive bands are electrically connected.

2. The electronic stun grenade of claim 1, wherein at least one of the electrically conductive bands comprises a first LED mounted on a first electrical track and a second LED mounted on a second electrical track, wherein the first LED and the second LED are electrically connected in parallel.

3. The electronic stun grenade of claim 2, wherein a first of the electrically conductive bands is electrically connected in series with a second of the electrically conductive bands.

4. The electronic stun grenade of claim 1, wherein at least one of the electrically conductive bands comprises copper.

5. The electronic stun grenade of claim 1, wherein the means for powering is a Lithium High Voltage battery.

6. The electronic stun grenade of claim 1, further comprising a means for controlling the LEDs.

7. The electronic stun grenade of claim 6 wherein the means for controlling comprises a microcontroller configured to control a brightness of the LEDs, a delay between pulses of light, or a duration of the pulses of light.

8. The electronic stun grenade of claim 1, wherein the closed first end is rounded in shape.

9. The electronic stun grenade of claim 1, further comprising a light transmissive coating covering at least the LEDs and an outer surface of the casing.

10. A projectile comprising the electronic stun grenade of claim 1, wherein the projectile has a maximum diameter substantially equal to 40 mm.

11. The electronic stun grenade of claim 1, wherein at least one of the electrically conductive bands is mounted onto one of the spacer elements.

12. The electronic stun grenade of claim 1, wherein at least one of the electrically conductive bands is mounted onto one of the spacer elements.

13. The electronic stun grenade of claim 1, wherein at least part of the electronic stun grenade is covered with a transparent coating.

14. The electronic stun grenade of claim 1, wherein the spacer elements are substantially circular.

* * * * *

UNITED STATES PATENT AND TRADEMARK OFFICE
CERTIFICATE OF CORRECTION

PATENT NO.        : 11,867,486 B2
APPLICATION NO.   : 17/055162
DATED             : January 9, 2024
INVENTOR(S)       : Ross Colbourne It is certified that error appears in the above-identified patent and that said Letters Patent is hereby corrected as shown below:

In the Claims

Column 6, Line 18, Claim 1 replace "tive bands comprising a least one Light Emitting Diode" with -- tive bands comprising at least one Light Emitting Diode --.

Signed and Sealed this
Fourteenth Day of May, 2024

Katherine Kelly Vidal
*Director of the United States Patent and Trademark Office*